(12) United States Patent
Fujimoto

(10) Patent No.: US 7,778,298 B2
(45) Date of Patent: Aug. 17, 2010

(54) SEMICONDUCTOR LASER DEVICE

(75) Inventor: Tsuyoshi Fujimoto, Naka (JP)

(73) Assignee: Optoenergy, Inc., Chiba (JP)

( * ) Notice: Subject to any disclaimer, the term of this patent is extended or adjusted under 35 U.S.C. 154(b) by 91 days.

(21) Appl. No.: 11/887,412

(22) PCT Filed: Mar. 30, 2006

(86) PCT No.: PCT/JP2006/306759

§ 371 (c)(1),
(2), (4) Date: Sep. 28, 2007

(87) PCT Pub. No.: WO2006/106886

PCT Pub. Date: Oct. 12, 2006

(65) Prior Publication Data

US 2008/0285611 A1    Nov. 20, 2008

(30) Foreign Application Priority Data

Mar. 30, 2005   (JP) ............................ 2005-100209

(51) Int. Cl.
*H01S 5/00* (2006.01)

(52) U.S. Cl. ................................. 372/45.012

(58) Field of Classification Search ............. 372/45.012
See application file for complete search history.

(56) References Cited

U.S. PATENT DOCUMENTS

| | | | |
|---|---|---|---|
| 4,845,724 A * | 7/1989 | Hayakawa et al. ....... 372/45.01 | |
| 5,065,200 A | 11/1991 | Bhat et al. | |
| 5,403,775 A * | 4/1995 | Holonyak et al. ............. 438/38 | |
| 5,668,048 A | 9/1997 | Kondo et al. | |
| 5,783,845 A | 7/1998 | Kondo et al. | |

FOREIGN PATENT DOCUMENTS

| | | | |
|---|---|---|---|
| JP | 62-065491 | | 3/1987 |
| JP | 62065491 A | * | 3/1987 |
| JP | 5-502331 | | 4/1993 |
| JP | 6-283801 | | 10/1994 |
| JP | 7-245315 | | 9/1995 |
| JP | 2000-022268 | | 1/2000 |
| JP | 2001-308445 | | 11/2001 |

* cited by examiner

*Primary Examiner*—Minsun Harvey
*Assistant Examiner*—Patrick Stafford
(74) *Attorney, Agent, or Firm*—Harness, Dickey & Pierce, P.L.C.

(57) ABSTRACT

An object of the invention is to achieve a high output gain waveguide semiconductor laser device exhibiting high reliability by suppressing growth of <100>DLD. A semiconductor laser device includes a semiconductor laser structure of a gain waveguide formed on a semiconductor substrate in which two grooves extending in an oscillation direction thereof are formed, wherein a current injection stripe is arranged between the two grooves. Preferably, a quantum well constituting an active layer of the semiconductor laser device is composed of GaAs.

20 Claims, 5 Drawing Sheets

FIG. 1
SEMICONDUCTOR LASER DEVICE 20
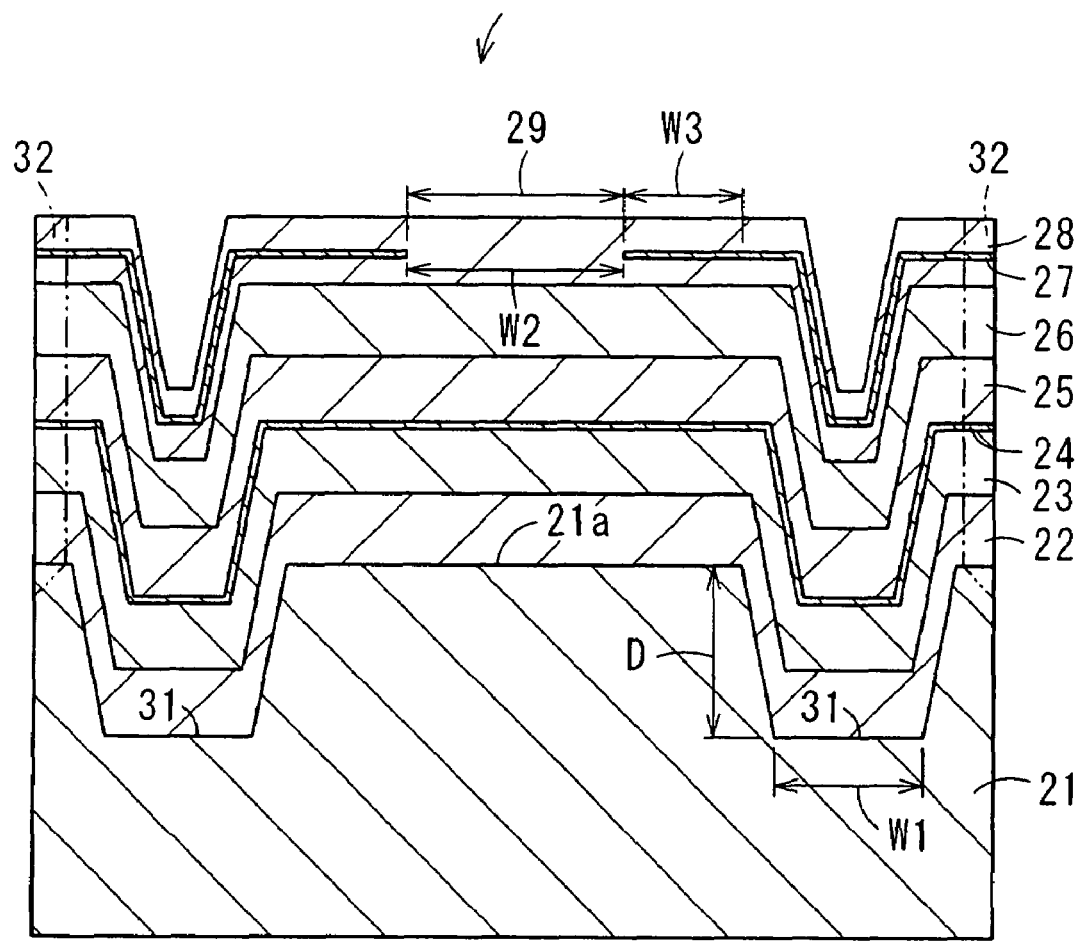
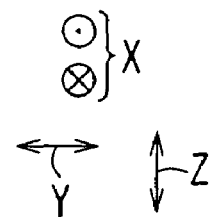

FIG. 4
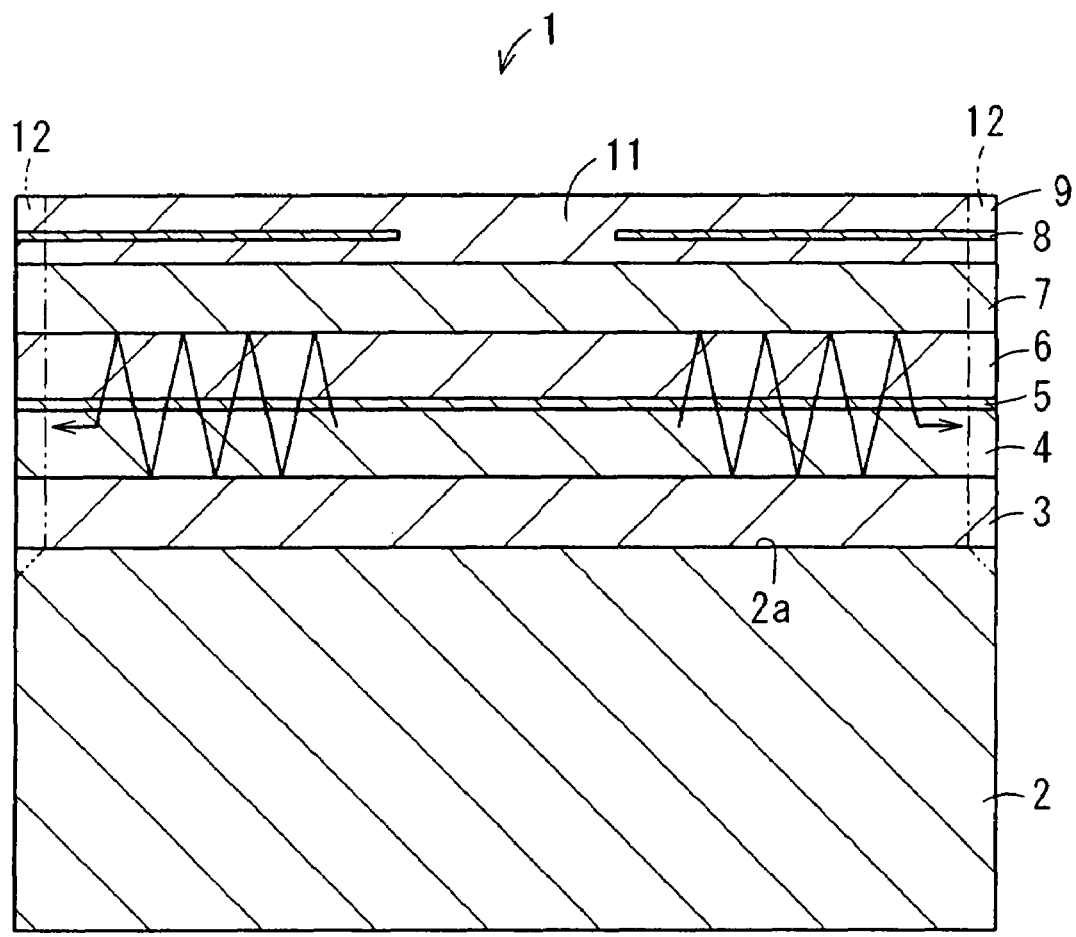
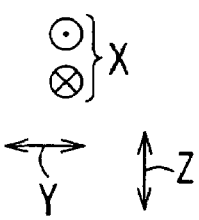

SEMICONDUCTOR LASER DEVICE

TECHNICAL FIELD

The present invention relates to a gain waveguide high-power semiconductor laser device which is good in durability.

BACKGROUND ART

In recent years, there have been widely used broad-area semiconductor laser devices having a broad current injection stripe width as light excitation sources of solid-state lasers, fiber lasers, and double-clad erbium-doped optical amplifiers or the like, and further as light sources for direct processing of metal or resin. As the range of their application fields becomes wider as mentioned above, the broad-area semiconductor laser devices are increasingly required to have not only high output, but also high reliability (See Japanese Unexamined Patent Publication JP-A 2001-308445). The broad-area semiconductor laser devices include gain waveguide semiconductor laser devices.

FIG. 4 is a sectional view showing a constitution of a conventional gain waveguide semiconductor laser device 1. In the semiconductor laser device 1, a first cladding layer 3, a first optical waveguide layer 4, an active layer 5, a second optical waveguide layer 6, a second cladding layer 7, a current confinement layer 8, and a contact layer 9 are formed on a surface 2a of a planar semiconductor substrate 2 in a thickness direction Z thereof. A current injection region (which is a current injection stripe) 11 is formed in a midportion in a transverse direction Y of the planar semiconductor substrate 2, which is perpendicular to both an oscillation direction X and the thickness direction Z thereof.

<100>DLD (Dark Line Defect) is known as one reason for deteriorating reliability of the broad-area semiconductor laser devices. Further, it is known that the <100>DLD grows with defects introduced by scribing or the like at the time of manufacturing a semiconductor laser device, as starting points. When a current is injected to a semiconductor laser device, spontaneous emission light having an intensity equal to the laser oscillation threshold or lower is emitted. In the conventional gain waveguide semiconductor laser device 1 as shown in FIG. 4, no light confinement structure is formed in the transverse direction thereof. For this reason, the spontaneous emission light which occurred in the current injection region 11 is absorbed by the active layer 5, while being propagated by the first and second optical waveguide layers 4 and 6 which are part of the laser structure thereof so as to reach a proximity of device ends 12 in the transverse direction Y of the semiconductor laser device 1. The resultant carriers generated according to the aforementioned process, will recombine at defects of the device ends 12 which are introduced by scribing or the like. The defects grow due to the recombination energy, and dislocation develops towards a crystal orientation <100>, resulting in the formation of <100>DLD.

FIGS. 5A and 5B are observation views obtained by observing the <100>DLD which has grown with a defect introduced by scribing in the conventional semiconductor laser device 1 shown in FIG. 4. FIG. 5A is an appearance image of the semiconductor laser device 1, and FIG. 5B is an image obtained by photographing electroluminescence of the semiconductor laser device 1 in FIG. 5A by means of a high sensitive CCD (Charge Coupled Device). When a gain waveguide semiconductor laser device such as the semiconductor laser device 1 shown in FIG. 4 is driven for a long period, due to the defect present in the device ends 12 in the transverse direction, the DLD grows from end facets of the device ends 12 in a 45-degree direction within one hypothetical plane parallel to both the oscillation direction X and the transverse direction Y. That is, the DLD grows along the crystal orientation <100>. The <100>DLD grows rapidly when reaching the current injection region 11, which becomes a serious problem of stopping laser oscillation.

DISCLOSURE OF INVENTION

An object of the invention is to achieve a high output gain waveguide semiconductor laser device exhibiting high reliability by suppressing growth of <100>DLD.

The invention provides a semiconductor laser device, comprising:

a semiconductor substrate in which two grooves extending in an oscillation direction thereof are formed; and a semiconductor laser structure of a gain waveguide formed on the semiconductor substrate, having a current injection region, the current injection region being located between the two grooves.

Further, in the invention, it is preferable that an active layer of the semiconductor laser device is composed of a GaAs quantum well.

BRIEF DESCRIPTION OF THE DRAWINGS

Other and further objects, features, and advantages of the invention will be more explicit from the following detailed description taken with reference to the drawings wherein:

FIG. 1 is a sectional view showing a constitution of a semiconductor laser device according to one embodiment of the invention;

FIG. 4 is a sectional view showing a constitution of a conventional gain waveguide semiconductor laser according to the comparative example;

BEST CONFIGURATION FOR CARRY OUT THE INVENTION

Figure 2:
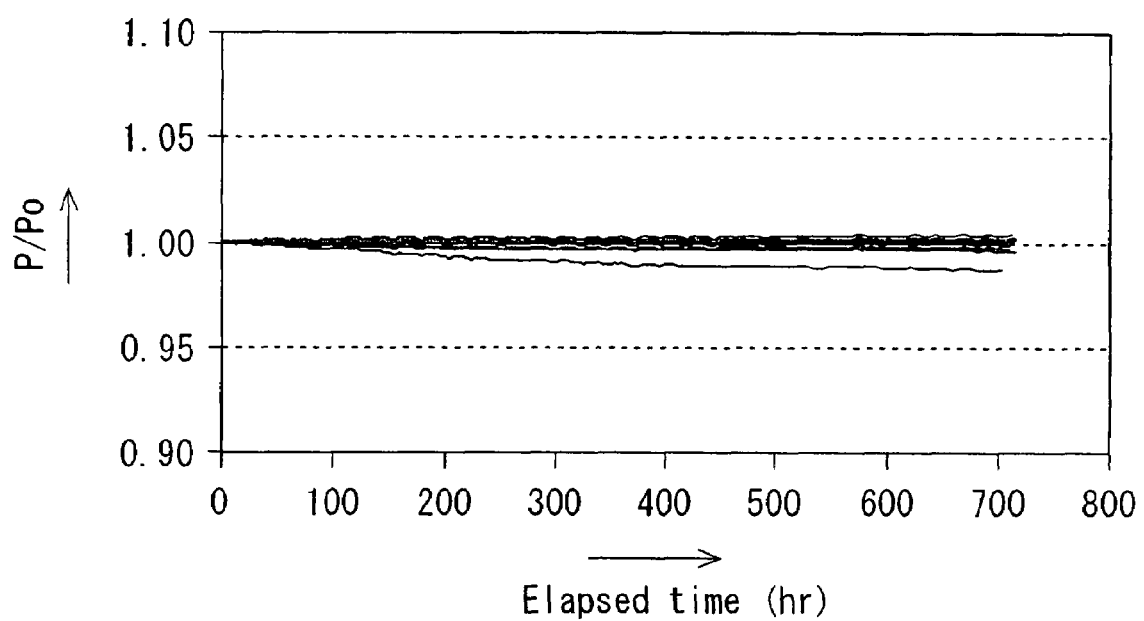
FIG. 2 is a graph showing results of life test of the semiconductor laser device according to the embodiment.

Now referring to the drawings, preferred embodiments of the invention are described below.

FIG. 1 is a sectional view showing a constitution of a semiconductor laser device 20 according to one embodiment of the invention. In the semiconductor laser device 20, a laser structure and a current injection region (which is a current injection stripe) 29 (a stripe width W2: 100 μm) are formed on an n-type GaAs semiconductor substrate 21 where two grooves (a bottom opening width W1: 20 μm; a depth D: 1 μm) 31 extending in an oscillation direction X are formed by chemical etching. That is, the laser structure is constituted in such a manner that an n-type $Al_{0.48}Ga_{0.52}As$ cladding layer 22 (thickness: 0.9 μm), an n-type $Al_{0.31}Ga_{0.66}As$ optical waveguide layer 23 (thickness: 0.4 μm), an active layer 24 comprising an n-type $Al_{0.62}Ga_{0.38}As$ carrier blocking layer (thickness: 0.013 μm), a $GaAs/Al_{0.31}Ga_{0.69}As$ quantum well layer and a p-type $Al_{0.50}Ga_{0.50}As$ carrier blocking layer (thickness: 0.020 μm), a p-type $Al_{0.31}Ga_{0.66}As$ optical waveguide layer 25 (thickness: 0.4 μm), a p-type $Al_{0.49}Ga_{0.52}As$ cladding layer 26 (thickness: 0.9 μm), an n-type GaAs current confinement layer 27 (thickness: 0.4 μm), and a p-type GaAs contact layer 28 (thickness: 1.7 μm) where the current confinement layer 27 is embedded, are sequentially formed on a whole surface 21a, in a thickness direction Z thereof, comprising a surface facing the grooves 31, by using metal organic vapor phase epitaxy, photolithography, and chemical etching which are all well-known techniques. And the current injection region 29 is formed at a midportion in a transverse direction Y thereof.

Further, the current injection stripe 29 is formed at a position (distance W3 from a stripe end to a groove end located on the side of the stripe end: 60 μm) between the two grooves 31 formed in the semiconductor substrate 21. The semiconductor laser device 20 of the invention has a constitution where the waveguide layers bend to two outer sides of the current injection stripe 29 in the transverse direction perpendicular to the oscillation direction thereof, so as to obtain the laser structure by means of crystal growth on the semiconductor substrate 21 where the grooves 31 are formed.

Further, in the embodiment, the invention is applied to a decoupled confinement heterostructure (abbreviated as DCH), but even the invention is effectively applied to an already known separated confinement heterostructure (abbreviated as SCH), as mentioned above, by forming the current injection stripe between grooves formed in the semiconductor substrate. In this case, no carrier blocking layer is required, so the carrier blocking layers are not necessary for the embodiment.

Further, it is preferable that the depth D of the grooves 31 is selected to be a value equal to a waveguide mode width of the current injection stripe 29 or more. For example, for the DCH structure, it is preferable that the depth D of the grooves 31 is equal to or more than the value calculated by adding the respective thicknesses of the optical waveguide layer 23, the optical waveguide layer 25, and the active layer 24 mentioned above.

Further, the thickness, composition, and impurity doping amount or the like of each of the layers can be determined appropriately so as to obtain a desired laser oscillation.

A life test was carried out in such a manner that a current is injected so as to maintain an output of 2 watt (W) of the semiconductor laser device 20 at a temperature of 50° C. The life test was carried out after the semiconductor laser device 20 had been screened for 400 hours under the same conditions as those in the life test.

FIG. 2 is a graph showing results of a life test of the semiconductor laser device 20 of the embodiment. The horizontal axis shows an elapsed time measured from a time when the current is injected, and the unit thereof is hour (hr). Further, the longitudinal axis shows a value (P/Po) calculated by dividing an output power P after operation for a predetermined time by an initial output power Po. As seen in FIG. 2, all of the twenty seven devices operate stably even after 700 hours. This is considered to be caused by, that the bending parts, formed on the both sides of the current injection stripe 29, of the optical waveguide layers 23 and 25, suppressed propagation of spontaneous emission light occurring in the current injection region, to the device ends 32 in the transverse direction Y. This results in that the growth of <100>DLD can be suppressed.

COMPARATIVE EXAMPLE

As a comparative example, gain waveguide semiconductor laser devices shown in FIG. 4 were prepared. Except that grooves were not processed in an n-type GaAs semiconductor substrate 2, the semiconductor laser devices prepared as the comparative example have the same constitution in the semiconductor layers of the laser structure and the manufacture method thereof as those of the embodiment.

The same as in the embodiment, a life test for the comparative example was carried out in such a manner that a current was injected so as to maintain an output of 2 watt (W) of the semiconductor laser device 20 at a temperature of 50° C. The same as in the embodiment, the life test was carried out after the semiconductor laser devices 20 had been screened for 400 hours under the same conditions as those in the continuous energization test.

Figure 3:
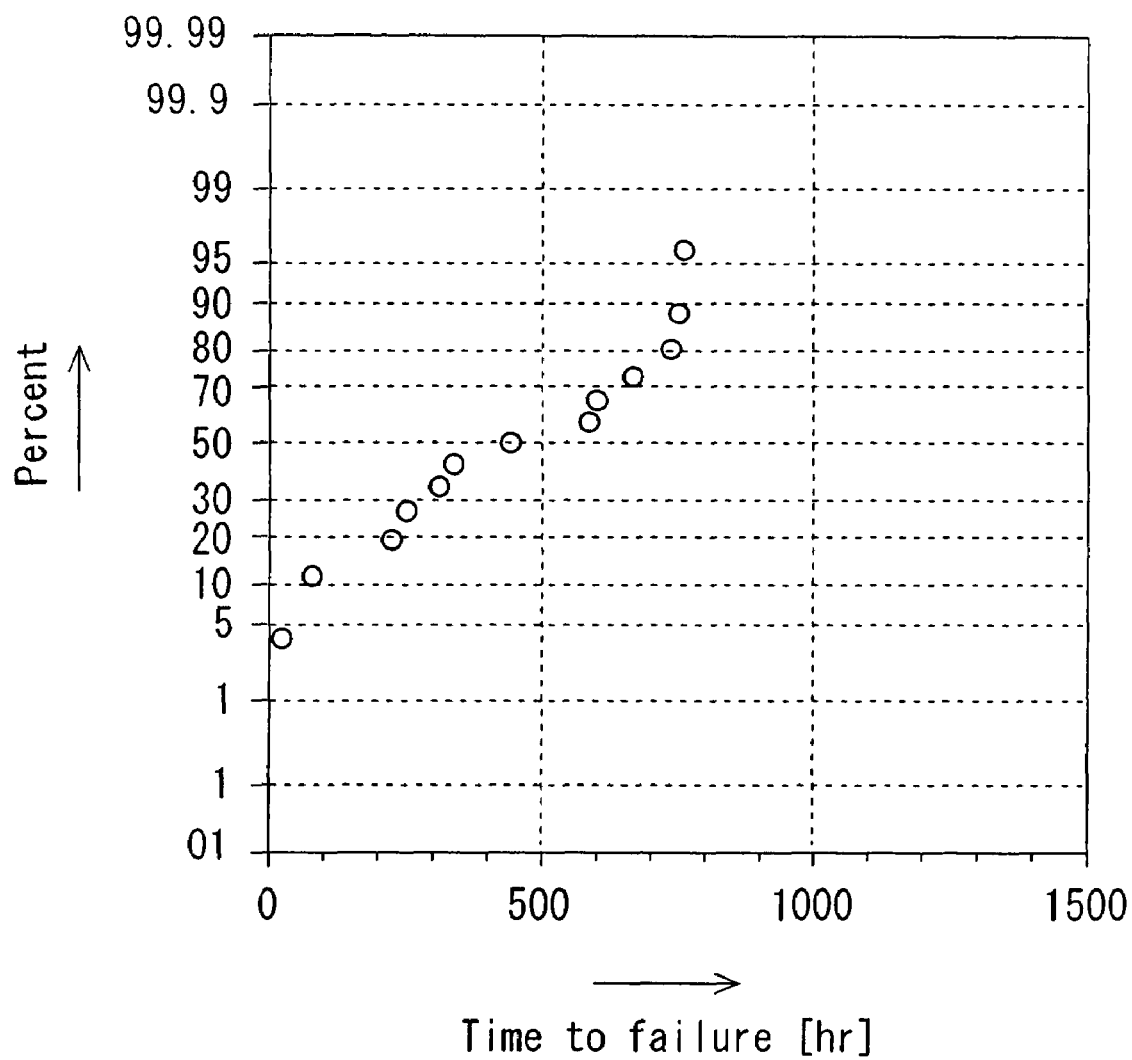
FIG. 3 is a graph showing results of a life test of a conventional semiconductor laser device according to a comparative example.
Figure 5A:
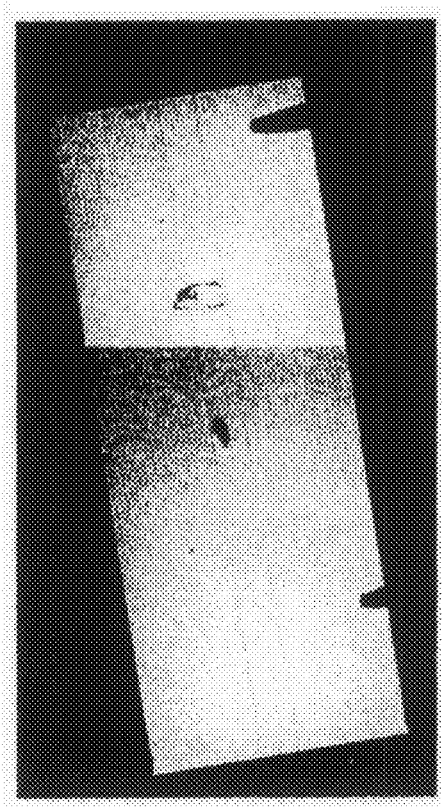
FIG. 5 is an observation image obtained by observing a semiconductor laser device where a <100>DLD occurred.
Figure 5B:
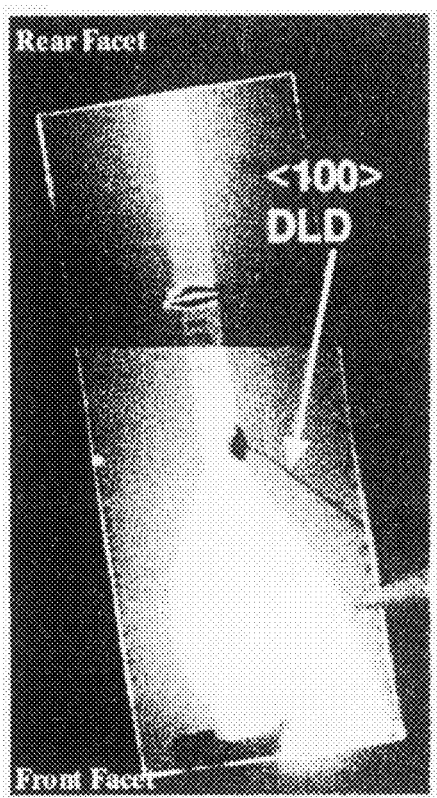

FIG. 3 is a graph showing probability distribution results after a life test of the gain waveguide semiconductor laser devices according to the comparative example. In FIG. 3, the horizontal axis shows a time to failure, which is measured from a time when current is injected to a time when a failure occurs. The longitudinal axis in FIG. 3 shows failure probability of the semiconductor laser device. The unit of the horizontal axis thereof is hour (hr).

For the semiconductor laser devices of the comparative example, all of the thirteen devices stopped oscillation, after having been driven continuously for 700 hours.

The reason why the semiconductor laser devices of the comparative example that is the semiconductor laser devices 1 manufactured by conventional techniques cannot endure a continuous driving as mentioned above, that is, the reason for low reliability, as described above, is the occurrence of <100>DLD. Further, the reason for the occurrence of <100>DLD is that no light confinement structure is formed in the transverse direction Y. In the semiconductor laser devices of the comparative example, no light confinement structure is formed in the transverse direction Y thereof, so emitted spontaneous emission light, the same as in FIG. 4, is absorbed by the active layer 5 while being propagated by the optical waveguide layers 4 and 6. The occurrence of <100>DLD is considered to be in the following way: spontaneous emission light is propagated so as to reach a proximity of device ends 12, the carriers generated by the absorption of the active layer 5 recombine at defective sites formed by scribing or the like, and the defects grow thereby due to the recombination energy thereof, resulting in the occurrence of <100>DLD.

As apparent in the embodiment and the comparative example, in the gain waveguide semiconductor laser device 20 where the respective semiconductor layers are formed by crystal growth on the semiconductor substrate 21 in which the grooves 31 are formed, bending parts, formed on both sides of the current injection stripe 29, of the waveguide layers can prevent the spontaneous emission light which occurs in the region of the current injection stripe 29, from being propagated to the device ends. Therefore, this enables the growth of <100>DLD which is a conventional problem, to be suppressed, and makes long-time continuous stable operations possible. That is, according to the invention, a high output semiconductor laser device exhibiting high reliability can be achieved. Further, only a step of processing the grooves 31 in the semiconductor substrate 21 of the semiconductor laser device 20 in the invention is added to manufacture the semiconductor laser device 20 of the invention, so the semiconductor laser device in the invention is possibly manufactured using the same crystal growth process as that used for the semiconductor laser device 21 manufactured by the conventional techniques. Accordingly, without adding any other processes and without increasing manufacture cost caused by a film formation process, the semiconductor laser device in the invention can be easily achieved.

Further, it is known experimentally that growth rate of <100>DLD is different in accordance with materials constituting a quantum well. When a quantum well composed of GaAs and a quantum well composed of InGaAs are compared with each other, the <100>DLD growth rate of the GaAs quantum well is approximately one order of magnitude higher than that of the InGaAs quantum well. Accordingly, a gain waveguide semiconductor laser device having an active layer where the quantum well is composed of GaAs, can exert the effect of the invention more remarkably.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

The semiconductor laser device of the invention can be used as a laser source of high output laser installation for laser processing.

In a gain waveguide semiconductor laser device where on a semiconductor substrate in which two grooves extending in the oscillation direction are formed, respective semiconductor layers are formed by means of crystal growth so that a current injection region is located between the two grooves, the growth of <100>DLD which is a conventional problem, can be suppressed, and a high output semiconductor laser device exhibiting high reliability, can be achieved. Further, the semiconductor laser device can be manufactured by only modifying the manufacture of the semiconductor substrate. Accordingly, the semiconductor laser device can be achieved easily without adding any other processes or the like and without increasing cost or the like.

The invention claimed is:

1. A semiconductor laser device, comprising:
   a semiconductor substrate in which two grooves extending in an oscillation direction thereof are formed; and
   a semiconductor laser structure of a gain waveguide formed on the semiconductor substrate, having a current injection region,
   wherein the current injection region being located between the two grooves, and
   the semiconductor laser structure has a constitution where a waveguide layer bends in the thickness direction of the semiconductor laser device corresponding to the shape of the grooves between device ends in the transverse direction perpendicular to the oscillation direction and the current injection stripe.

2. The semiconductor laser device of claim 1, wherein an active layer of the semiconductor laser device is composed of a GaAs quantum well.

3. The semiconductor laser device of claim 1, wherein the semiconductor laser structure includes,
   a n-type cladding layer,
   a n-type optical waveguide layer,
   an active layer including an n-type carrier blocking layer a quantum well and a p-type carrier blocking layer,
   a p-type optical waveguide layer,
   a p-type cladding layer,
   a n-type current confinement layer, and
   a p-type contact layer.

4. The semiconductor laser device of claim 1, wherein the semiconductor laser structure includes,
   a n-type cladding layer,
   a n-type optical waveguide layer,
   an active layer including a quantum well,
   a p-type optical waveguide layer,
   a p-type cladding layer,
   a n-type current confinement layer, and
   a p-type contact layer.

5. The semiconductor laser device of claim 1, wherein the two grooves are 20 µm wide and 1 µm deep.

6. The semiconductor laser device of claim 1, wherein a depth of the two grooves is equal to a waveguide mode width of the current injection region.

7. The semiconductor laser device of claim 1, wherein a depth of the two grooves is greater than a waveguide mode width of the current injection stripe.

8. The semiconductor laser device of claim 1, wherein the current injection region 100 µm wide.

9. The semiconductor laser device of claim 1, wherein the current injection region is centered at a midpoint between the two grooves.

10. A semiconductor device, comprising:
    a semiconductor substrate in which two grooves extending in an oscillation direction thereof are formed;
    a n-type cladding layer formed on the semiconductor substrate;
    a n-type optical waveguide layer formed on the n-type cladding layer;
    an active layer, formed on the n-type optical waveguide layer, including an n-type carrier blocking layer a quantum well and a p-type carrier blocking layer;
    a p-type optical waveguide layer formed on the active layer;
    a p-type cladding layer formed on the p-type optical waveguide layer;
    a n-type current confinement layer formed on the p-type cladding layer;
    and
    a p-type contact layer formed on the n-type current confinement layer,
    wherein
       the two grooves extend from the semiconductor substrate to the p-type contact layer,
       a current injection region is formed in the n-type current confinement layer and the p-type contact layer, the current injection region being located between the two grooves, and
       the waveguide layer bends in the thickness direction of the semiconductor device corresponding to the shape of the grooves between device ends in the transverse direction perpendicular to the oscillation direction and the current injection stripe.

11. The semiconductor device of claim 10, wherein the active layer of the semiconductor device is composed of a GaAs quantum well.

12. The semiconductor device of claim 10, wherein the two grooves are 20 µm wide and 1 µm deep.

13. The semiconductor device of claim 10, wherein a depth of the two grooves is equal to a waveguide mode width of the current injection region.

14. The semiconductor device of claim 10, wherein a depth of the two grooves is greater than a waveguide mode width of the current injection stripe.

15. The semiconductor device of claim 10, wherein the current injection region 100 µm wide.

16. The semiconductor device of claim 10, wherein the current injection region is centered at a midpoint between the two grooves.

17. A semiconductor device, comprising:
a semiconductor substrate in which two grooves extending in an oscillation direction thereof are formed;
a n-type cladding layer formed on the semiconductor substrate;
a n-type optical waveguide layer formed on the n-type cladding layer;
an active layer formed on the n-type optical waveguide layer;
a p-type optical waveguide layer formed on the active layer;
a p-type cladding layer formed on the p-type optical waveguide layer;
a n-type current confinement layer formed on the p-type cladding layer; and
a p-type contact layer formed on the n-type current confinement layer,
wherein
the two grooves extend from the semiconductor substrate to the p-type contact layer,
a current injection region is formed in the n-type current confinement layer and the p-type contact layer, the current injection region being located between the two grooves, and
the waveguide layer bends in the thickness direction of the semiconductor device corresponding to the shape of the grooves between device ends in the transverse direction perpendicular to the oscillation direction and the current injection stripe.

18. The semiconductor device of claim 17, wherein the active layer of the semiconductor device is composed of a GaAs quantum well.

19. The semiconductor device of claim 17, wherein a depth of the two grooves is equal to a waveguide mode width of the current injection region.

20. The semiconductor device of claim 17, wherein the current injection region is centered at a midpoint between the two grooves.

* * * * *